United States Patent
Kong

(10) Patent No.: US 9,431,093 B2
(45) Date of Patent: Aug. 30, 2016

(54) SEMICONDUCTOR DEVICE AND METHOD OF DRIVING THE SAME

(71) Applicant: SK hynix Inc., Gyeonggi-do (KR)

(72) Inventor: Kyu-Bong Kong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/643,598

(22) Filed: Mar. 10, 2015

(65) Prior Publication Data

US 2016/0180914 A1    Jun. 23, 2016

(30) Foreign Application Priority Data

Dec. 19, 2014    (KR) ................... 10-2014-0184656

(51) Int. Cl.
| | | |
|---|---|---|
| G11C 11/406 | (2006.01) | |
| G11C 11/4093 | (2006.01) | |
| G11C 7/22 | (2006.01) | |

(52) U.S. Cl.
CPC ........... *G11C 11/4093* (2013.01); *G11C 7/222* (2013.01); *G11C 11/406* (2013.01)

(58) Field of Classification Search
CPC .............................. G11C 11/406; G11C 7/222
USPC ............................................. 365/189.05, 222
See application file for complete search history.

(56) References Cited

U.S. PATENT DOCUMENTS

| 8,437,216 | B2* | 5/2013 | Oh ....................... | G11C 7/1087 365/185.28 |
|---|---|---|---|---|
| 8,514,639 | B2* | 8/2013 | Na ....................... | G11C 7/1072 365/194 |
| 2007/0245096 | A1* | 10/2007 | Dietrich ............. | G06F 13/1689 711/154 |
| 2010/0165758 | A1* | 7/2010 | Park ..................... | G11C 7/1006 365/193 |
| 2012/0087194 | A1* | 4/2012 | Oh ....................... | G11C 7/1087 365/189.16 |
| 2012/0106278 | A1* | 5/2012 | Na ....................... | G11C 7/1072 365/194 |
| 2012/0123726 | A1* | 5/2012 | Sakai ................ | G01R 31/3193 702/117 |

FOREIGN PATENT DOCUMENTS

KR        1020100052669        5/2010

* cited by examiner

*Primary Examiner* — Michael Tran
(74) *Attorney, Agent, or Firm* — IP & T Group LLP

(57) ABSTRACT

A semiconductor device includes: a control block suitable for generating a clock control signal in response to a write training signal and a write-related information signal; and an input block suitable for receiving a data signal for a write training mode in response to the clock control signal and a clock signal.

19 Claims, 8 Drawing Sheets

SEMICONDUCTOR DEVICE AND METHOD OF DRIVING THE SAME

CROSS-REFERENCE TO RELATED APPLICATIONS

The present application claims priority of Korean Patent Application No. 10-2014-0184656, filed on Dec. 19, 2014, which is incorporated herein by reference in its entirety.

BACKGROUND

1. Field

Exemplary embodiments of the present invention relate to a semiconductor design technology and, more particularly, to a semiconductor device using a clock signal and a method of driving the semiconductor device.

2. Description of the Related Art

Semiconductor devices use a clock signal to stably perform operations at prefixed timing. Clock signals typically toggle continuously. However, semiconductor devices do not always use a clock signal. In other words, semiconductor devices use clock signals, or different clock signals, during specified periods.

For example, a semiconductor device such as a Dynamic Random Access Memory (DRAM) uses a clock signal when a data signal is inputted/outputted. However, the semiconductor device receives the clock signal even when entering a refresh mode. Since the data signal is not inputted/outputted in the refresh mode, the semiconductor device does not need to receive the clock signal during the refresh mode. Nonetheless, the semiconductor device may continuously receive the clock signal even in the refresh mode because of a training mode. The semiconductor device may enter the training mode while entering the refresh mode, and a data signal may be inputted/outputted in the training mode.

Therefore, the semiconductor device needs to selectively receive the clock signal during a target section.

SUMMARY

Exemplary embodiments of the present invention are directed to a semiconductor device that whether or not a clock signal is inputted is controlled according to a training mode, and a method of driving the semiconductor device.

Exemplary embodiments of the present invention are directed to a semiconductor device that whether or not a clock signal is inputted is controlled according to a refresh mode or a training mode based on latency information, and a method of driving the semiconductor device.

In accordance with an embodiment of the present invention, a semiconductor device includes: a control block suitable for generating a clock control signal in response to a write training signal and a write related information signal; and an input block suitable for receiving a data signal for a write training mode in response to the clock control signal and a clock signal.

The write-related information signal may include write latency information and burst length information.

The control block may include: a first control unit suitable for generating a write training end signal in response to the write training signal and the write-related information signal; and a second control unit suitable for generating the clock control signal in response to the write training signal and the write training end signal.

The first control unit may include a shift register.
The second control unit may include an SR latch.

The input block may include: a clock limitation unit suitable for generating a limitation clock signal by defining a toggling section of the clock signal in response to the clock control signal; and an input buffer unit suitable for receiving the data signal in response to the limitation clock signal.

The semiconductor device may further include: a first pad suitable for receiving a command signal; a command decoding block suitable for generating the write training signal in response to the command signal; a Mode Register Set (MRS) circuit block suitable for generating the write-related information signal; and a second pad suitable for receiving the data signal.

In accordance with another embodiment of the present invention, a semiconductor device includes: a first clock control block suitable for generating a first control signal in response to a write training signal and a write-related information signal; a second clock control block suitable for generating a second control signal in response to a refresh signal and a precharge signal; a third clock control block suitable for generating a clock control signal by selecting one of the first and second control signals in response to the write-related information signal; and a data input block suitable for receiving a data signal for a write training mode in response to the clock control signal and a clock signal.

The write-related information signal may include write latency information and burst length information.

The first clock control block may include: a first control unit suitable for generating a write training end signal in response to the write training signal and the write-related information signal; and a second control unit suitable for generating the first control signal in response to the write training signal and the write training end signal.

The first control unit may include a shift register.
The second control unit may include an SR latch.
The second clock control block may include an SR latch.
The third clock control block may include: a selection control unit suitable for generating a selection control signal based on the write latency information and section information on a flight time between the write training signal and the first control signal; and a selection output unit suitable for outputting the clock control signal by selecting one of the first and second control signals in response to the selection control signal.

The selection control unit may include a storing part or storing the section information.

The data input block may include: a clock limitation unit suitable for generating a limitation clock signal by defining a toggling section of the clock signal in response to the clock control signal; and an input buffer unit suitable for receiving the data signal in response to the limitation clock signal.

The semiconductor device may further include: a first pad suitable for receiving a command signal; a command decoding block suitable for generating the write training signal, the refresh signal and the precharge signal in response to the command signal; a Mode Register Set (MRS) circuit block suitable for generating the write-related information signal; and a second pad suitable for receiving the data signal.

In accordance with another embodiment of the present invention, a method of driving a semiconductor device capable of entering a write training mode while entering a refresh mode includes: selecting one of a first control signal corresponding to the write training mode and a second control signal corresponding to the refresh mode by comparing write latency information with section information on a section ranging from when entering the write training mode to when the first control signal is generated; generating a clock control signal in response to the first control signal or the second control signal when entering the write training mode or the refresh mode; generating a limitation clock signal by defining a toggling section of a clock signal in response to the clock control signal; and receiving a data signal for a write training mode in response to the limitation clock signal.

The first control signal may be generated based on the write latency information and the burst length information when the semiconductor device enters the write training mode.

The second control signal may be generated in response to a refresh signal and a precharge signal when the semiconductor device enters the refresh mode.

DETAILED DESCRIPTION

Exemplary embodiments of the present invention are described below in more detail with reference to the accompanying drawings. These embodiments are provided so that this disclosure is thorough and complete, and fully conveys the scope of the present invention to those skilled in the art. All "embodiments" referred to in this disclosure refer to embodiments of the inventive concept disclosed herein. The embodiments presented are merely examples and are not intended to limit the inventive concept.

In the embodiments of the present invention, a write training mode and an auto refresh mode are described as an example.

Figure 1:
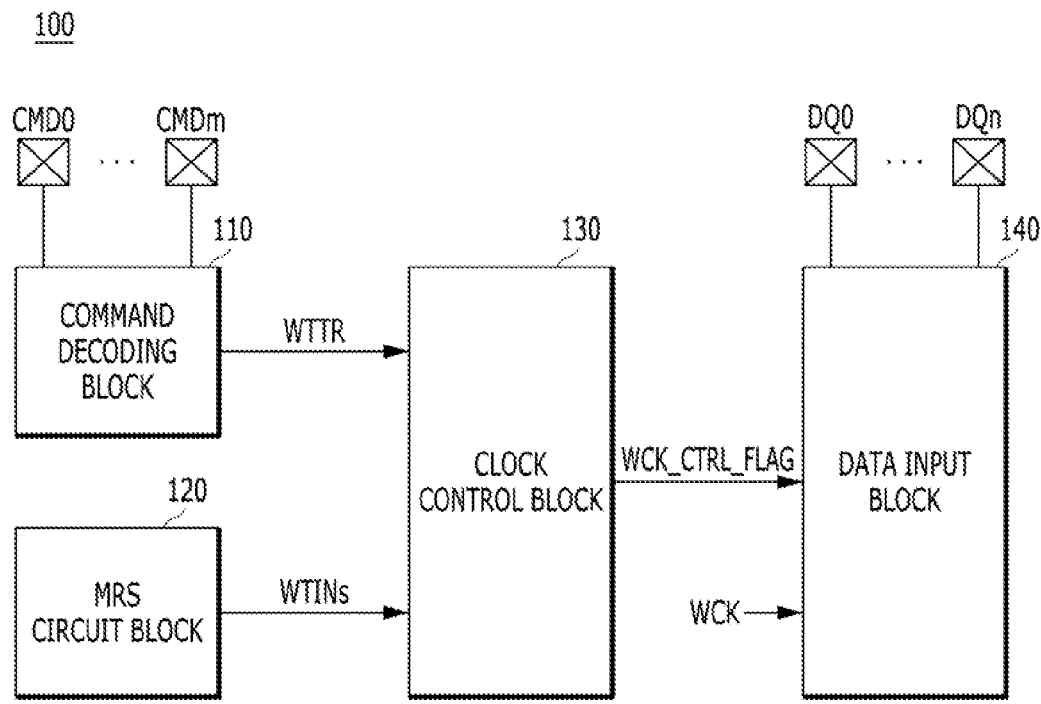
FIG. 1 is a block diagram illustrating a semiconductor device in accordance with an embodiment of the present invention.

FIG. 1 is a block diagram illustrating a semiconductor device in accordance with an embodiment of the present invention.

Referring to FIG. 1, the semiconductor device 100 may include command pads CMD0 to CMDm, a command decoding block 110, a Mode Register Set (MRS) circuit block 120, a clock control block 130, data pads DQ0 to DQn, and a data input block 140.

The command pads CMD0 to CMDm receive command signals. The command decoding block 110 generates a write training signal WTTR in response to the command signals. The MRS circuit block 120 generates a write-related information signal WTINs. The clock control block 130 generates a clock control signal WCK_CTRL_FLAG in response to the write training signal WTTR and the write-related information signal WTINs. The data pads DQ0 to DQn receive data signals for a write training mode. The data input block 140 receives the data signals in response to the clock control signal WCK_CTRL_FLAG and a clock signal WCK.

The command decoding block 110 may generate the write training signal WTTR by decoding the command signals. Although not illustrated the MRS circuit block 120 may generate the write-related information signal WTINs based on a combination of the command signals and address signals. Herein, the write-related information signal WTINs may include write latency information, burst length information and so on. Since the command decoding block 110 and the MRS circuit block 120 are widely known to those skilled in the art, a detailed description thereon is omitted.

Figure 2:
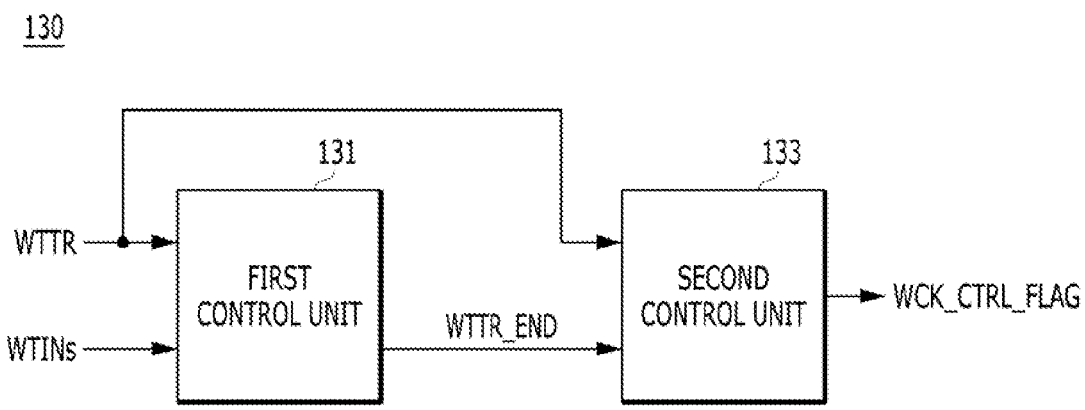
FIG. 2 is a block diagram illustrating a clock control block shown in FIG. 1.

FIG. 2 is a block diagram illustrating the clock control block 130 shown in FIG. 1.

Referring to FIG. 2, the clock control block 130 may include a first control unit 131 and a second control unit 133. The first control unit 131 generates a write training end signal WTTR_END in response to the write training signal WTTR and the write-related information signal WTINs. The second control unit 133 generates the clock control signal WCK_CTRL_FLAG in response to the write training signal WTTR and the write training end signal WTTR_END.

The first control unit 131 may generate the write training end signal WTTR_END by shifting the write training signal WTTR based on the write latency information and the burst length information included in the write-related information signal WTINs. For example, the first control unit 131 may include a shift register.

The second control unit 133 may enable the clock control signal WCK_CTRL_FLAG in response to the write training signal WTTR and disable the clock control signal WCK_CTRL_FLAG in response to the write training end signal WTTR_END. For example, the second control unit 133 may include an SR latch.

Figure 3:
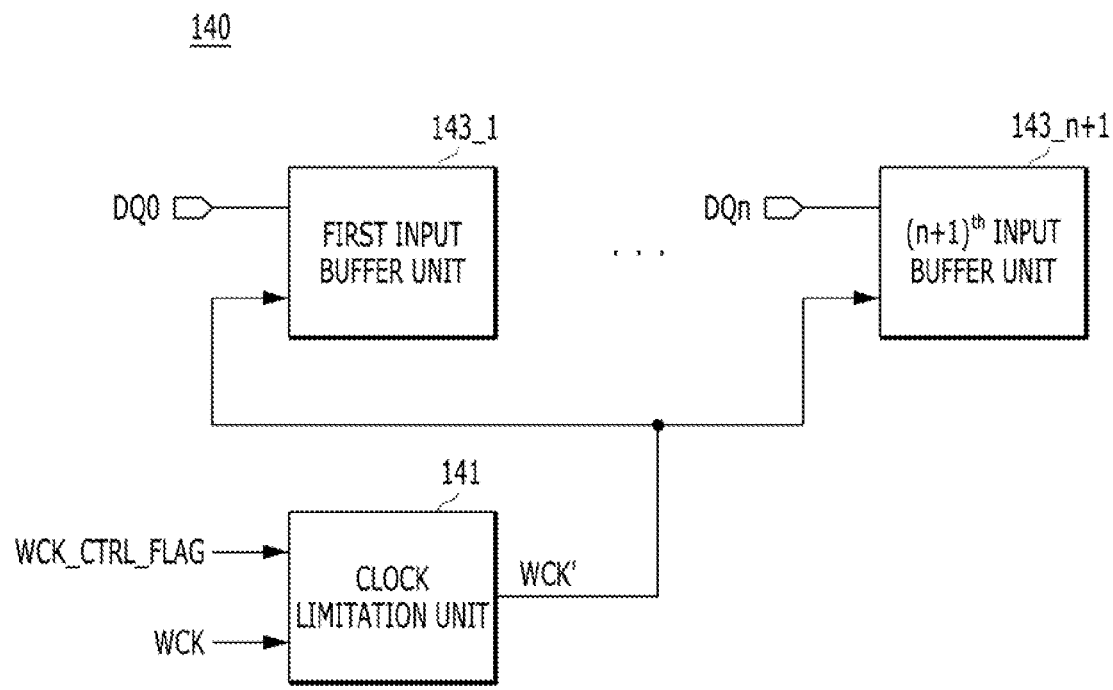
FIG. 3 is a block diagram illustrating a data input block shown in FIG. 1.
Figure 4:
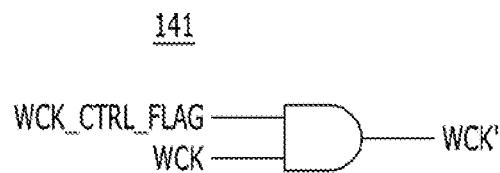
FIG. 4 is a circuit diagram illustrating a clock limitation unit shown in FIG. 3.

FIG. 3 is a block diagram illustrating the data input block 140 shown in FIG. 1. FIG. 4 is a circuit diagram illustrating a clock limitation unit 141 shown in FIG. 3.

Referring to FIG. 3, the data input block 140 may include the clock limitation unit 141 and input buffer units 143_1 to 143_n+1. The clock limitation unit 141 generates a limitation clock signal WCK' by defining a toggling section of the clock signal WCK in response to the clock control signal WCK_CTRL_FLAG. The input buffer units 143_1 to 143_n+1 receive the data signals in response to the limitation clock signal WCK'.

The clock limitation unit 141 may include an AND gate for performing an AND operation on the clock control signal WCK_CTRL_FLAG and the clock signal WCK as shown in FIG. 4. Herein, the clock signal WCK may be a dedicated clock signal for synchronizing the data signals.

Although not illustrated in the drawing, each of the input buffer units 143_1 to 143_n+1 may include a flip-flop for synchronizing the data signals with the limitation clock signal WCK' and transmitting the synchronized data signals.

Hereinafter, a method of driving the semiconductor device 100 having the aforementioned structure in accordance with the embodiment of the present invention is described with reference to FIGS. 1 to 5.

Figure 5:
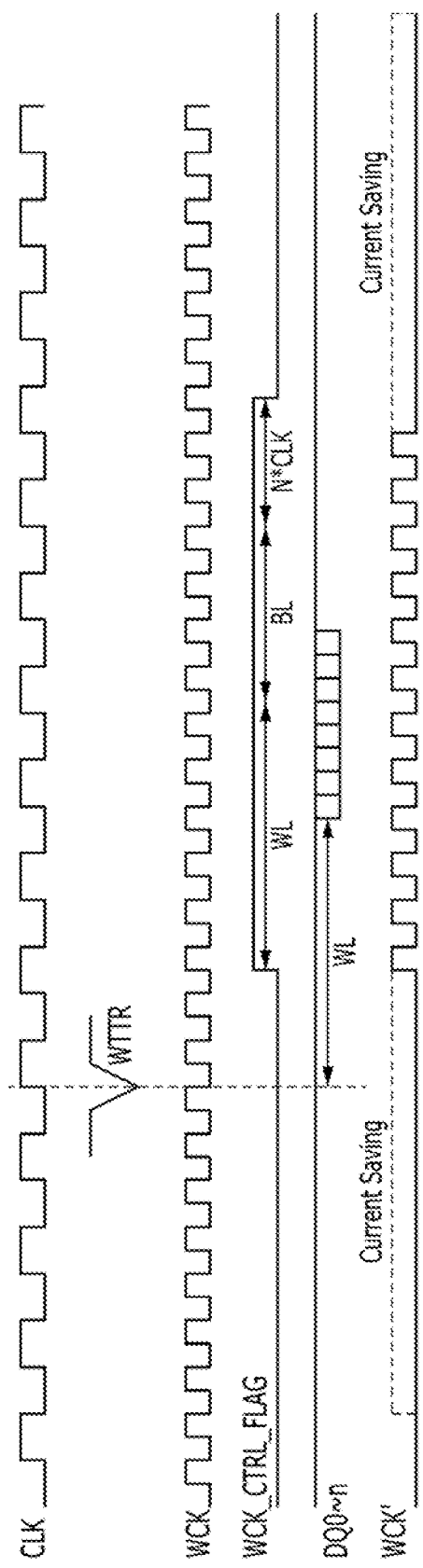
FIG. 5 is a timing diagram describing a method of driving the semiconductor device shown in FIG. 1.

FIG. 5 is a timing diagram describing a method of driving the semiconductor device 100 shown in FIG. 1.

Referring to FIG. 5, when the write training signal WTTR is generated from the command decoding block 110 in a state where the clock signal WCK is continuously inputted, the clock control block 130 may generate the clock control signal WCK_CTRL_FLAG based on the write latency information WL and the burst length information BL included in the write-related information signal WTINs. For example, the clock control block 130 may generate the write training end signal WTTR_END by shifting the write training signal WTTR by a given delay amount corresponding to the write latency information WL, the burst length information BL and predetermined clock information N*CLK. Further, the clock control block 130 may generate the clock control signal WCK_CTRL_FLAG that is enabled in response to the write training signal WTTR and disabled in response to the write training end signal WTTR_END.

The data input block 140 may receive the data signals inputted from the data pads DQ0 to DQn in response to the clock control signal WCK_CTRL_FLAG and the clock signal WCK. For example, the data input block 140 may define a toggling section of the clock signal WCK in response to the clock control signal WCK_CTRL_FLAG to generate the limitation clock signal WCK', synchronize the data signals with the limitation clock signal WCK', and transmit the synchronized data signals to internal circuits of the semiconductor device 100.

In accordance with the embodiment of the present invention as described above, the semiconductor device has the advantage of restrictively using the clock signal during a section corresponding to the write training mode.

Figure 6:
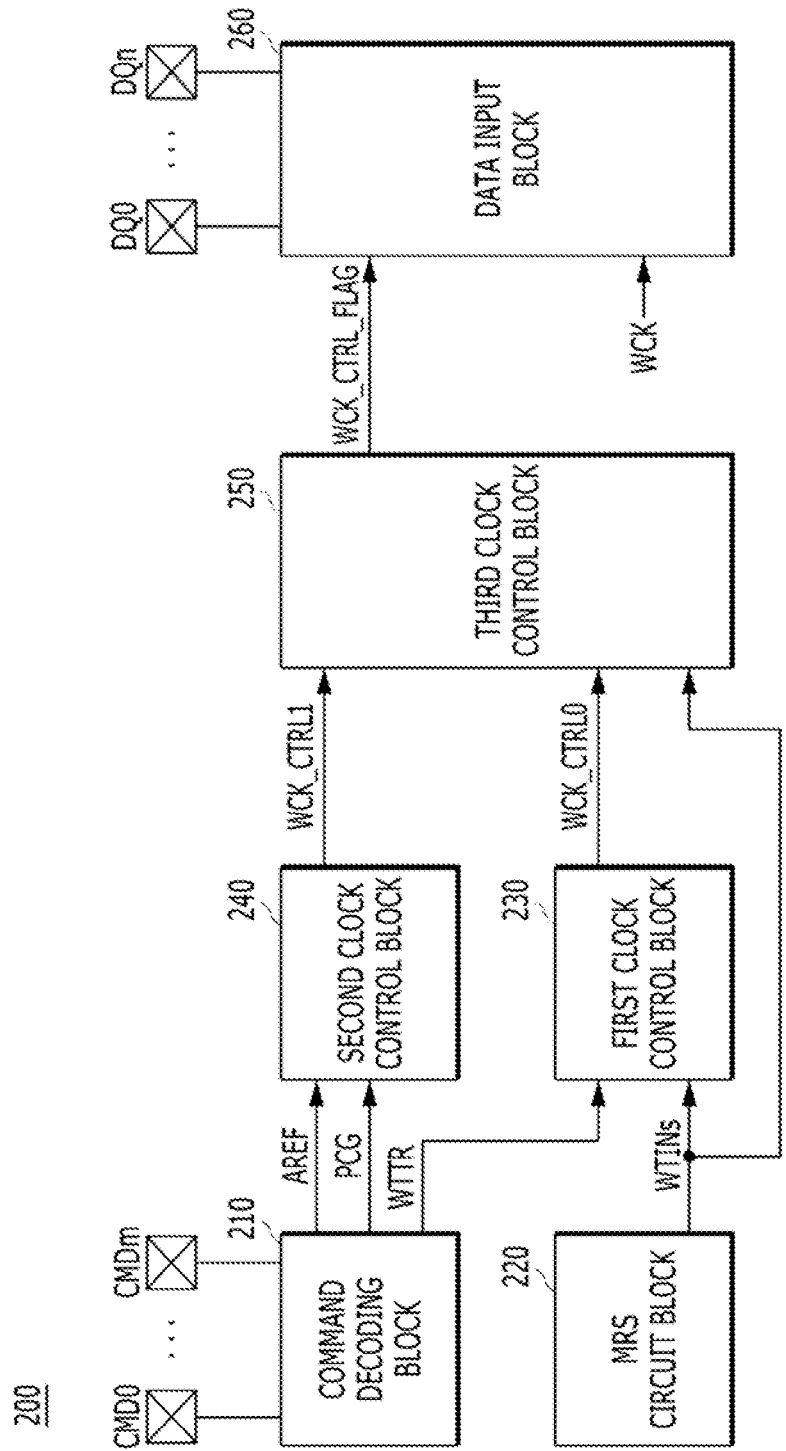
FIG. 6 is a block diagram illustrating a semiconductor device in accordance with another embodiment of the present invention.

FIG. 6 is a block diagram illustrating a semiconductor device in accordance with another embodiment of the present invention.

Referring to FIG. 6, the semiconductor device 200 may include command pads CMD0 to CMDm, a command decoding block 210, a Mode Register Set (MRS) circuit block 220, a first clock control block 230, a second clock control block 240, a third clock control block 250, data pads DQ0 to DQn, and a data input block 260.

The command pads CMD0 to CMDm receive command signals. The command decoding block 210 generates a write training signal WTTR, an auto refresh signal AREF and a precharge signal PCG in response to the command signals. The MRS circuit block 220 generates a write-related information signal WTINs. The first clock control block 230 generates a first control signal WCK_CTRL0 in response to the write training signal WTTR and the write-related information signal WTINs. The second clock control block 240 generates a second control signal WCK_CTRL1 in response to the auto refresh signal AREF and the precharge signal PCG. The third clock control block 250 generates a clock control signal WCK_CTRL_FLAG by selecting one of the first and second control signals WCK_CTRL0 and WCK_CTRL1 in response to the write-related information signal WTINs. The data pads DQ0 to DQn receive data signals for a write training mode. The data input block 260 receives the data signals in response to the clock control signal WCK_CTRL_FLAG and a clock signal WCK.

The command decoding block 210 may generate the write training signal WTTR the auto refresh signal AREF and the precharge signal PCG by decoding the command signals. Although not illustrated in the drawing, the MRS circuit block 220 may generate the write-related information signal WTINs based on a combination of the command signals and address signals. Herein, the write-related information signal WTINs may include write latency information, burst length information and so on. Since the command decoding block 210 and the MRS circuit block 220 are widely known to those skilled in the art, detailed descriptions thereon are omitted.

The second clock control block 240 may enable the second control signal WCK_CTRL1 in response to the auto refresh signal AREF and disable the second control signal WCK_CTRL1 in response to the precharge signal PCG. For example, the second clock control block 240 may include an SR latch.

Figure 7:
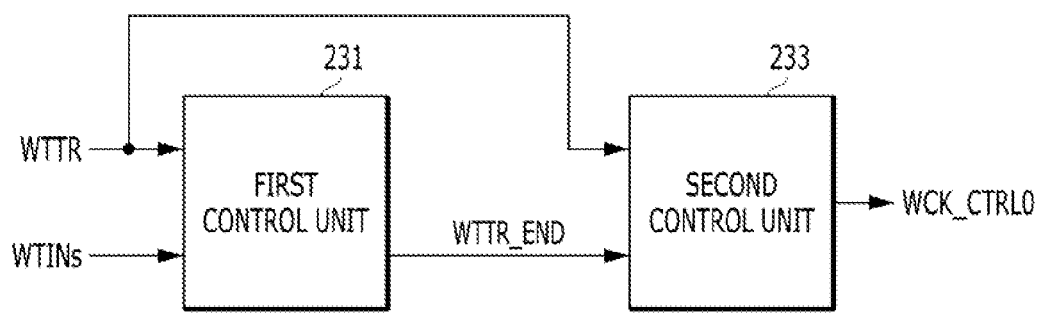
FIG. 7 is a block diagram illustrating a first clock control block shown in FIG. 6.

FIG. 7 is a block diagram illustrating the first clock control block 230 shown in FIG. 6.

Referring to FIG. 7, the first clock control block 230 may include a first control unit 231 and a second control unit 233. The first control unit 231 generates a write training end signal WTTR_END in response to the write training signal WTTR and the write-related information signal WTINs. The second control unit 233 generates the first control signal WCK_CTRL0 in response to the write training signal WTTR and the write training end signal WTTR_END.

The first control unit 231 may generate the write training end signal WTTR_END by shifting the write training signal WTTR based on the write latency information and the burst length information included in the write-related information signal WTINs. For example, the first control unit 231 may include a shift register.

The second control unit 233 may enable the first control signal WCK_CTRL0 in response to the write training signal WTTR and disable the first control signal WCK_CTRL0 in response to the write training end signal WTTR_END. For example, the second control unit 233 may include an SR latch.

Figure 8:
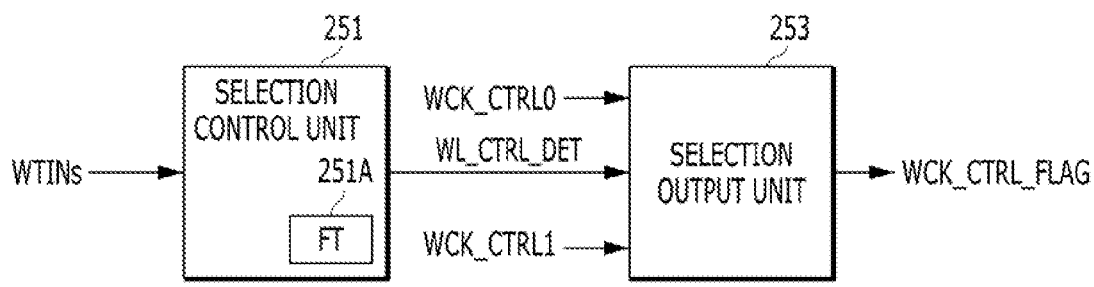
FIG. 8 is a block diagram illustrating a third clock control block shown in FIG. 6.

FIG. 8 is a block diagram illustrating the third clock control block 250 shown in FIG. 6.

Referring to FIG. 8 the third clock control block 250 may Include a selection control unit 251 and a selection output unit 253. The selection control unit 251 generates a selection control signal WL_CTRL_DET based on the write latency information included in the write-related information signal WTINs and section information FT. The selection output unit 253 outputs the clock control signal WCK_CTRL_FLAG in response to the selection control signal WL_CTRL_DET and the first and second control signals WCK_CTRL0 and WCK_CTRL1.

The selection control unit 251 may compare the section information FT with the write latency information to generate the selection control signal WL_CTRL_DET. The selection control unit 251 may include a storing part 251A for storing the section information FT.

The section information FT may include information on a section between the write training signal WTTR and the first control signal WCK_CTRL0, i.e., information on a flight time.

The selection output unit 253 may select one of the first control signal WCK_CTRL0 and the second control signal WCK_CTRL1 in response to the selection control signal WL_CTRL_DET, and output the selected control signal as the clock control signal WCK_CTRL_FLAG.

Figure 9:
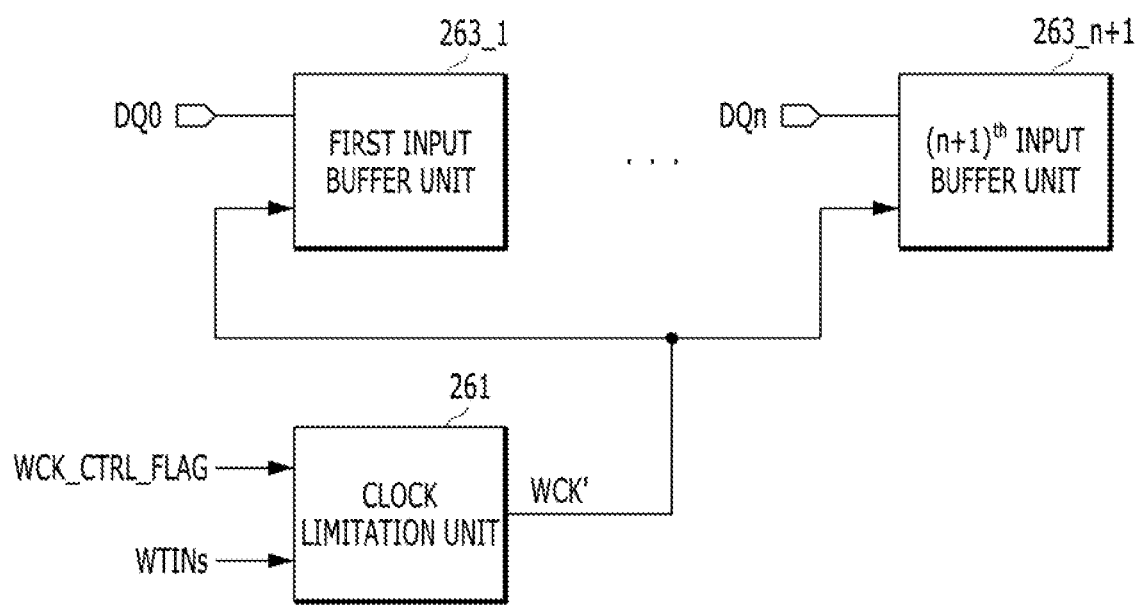
FIG. 9 is a block diagram illustrating a data input block shown in FIG. 6.
Figure 10:
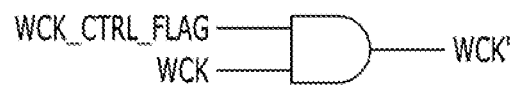
FIG. 10 is a circuit diagram illustrating a clock limitation unit shown in FIG. 9.

FIG. 9 is a block diagram illustrating the data input block 260 shown in FIG. 6. FIG. 10 is a circuit diagram illustrating a clock limitation unit 261 shown in FIG. 9.

Referring to FIG. 9, the data input block 260 may include the clock limitation unit 261 and input buffer units 263_1 to 263_n+1. The clock limitation unit 261 generates a limitation clock signal WCK' by defining a toggling section of the clock signal WCK in response to the clock control signal WCK_CTRL_FLAG. The input buffer units 263_1 to 263_n+1 receive the data signals in response to the limitation clock signal WCK'.

The clock limitation unit 261 may include an AND gate for performing an AND operation on the clock control signal WCK_CTRL_FLAG and the clock signal WCK as shown in FIG. 10. Herein, the clock signal WCK may be a dedicated clock signal for synchronizing the data signals.

Although not illustrated in the drawing, each of the input buffer units 263_1 to 263_n+1 may include a flip-flop for synchronizing the data signals with the limitation clock signal WCK' and transmitting the synchronized data signals.

Hereinafter, a method of driving the semiconductor device 200 having the aforementioned structure in accordance with the embodiment of the present invention is described with reference to FIGS. 6 to 12.

Figure 11:
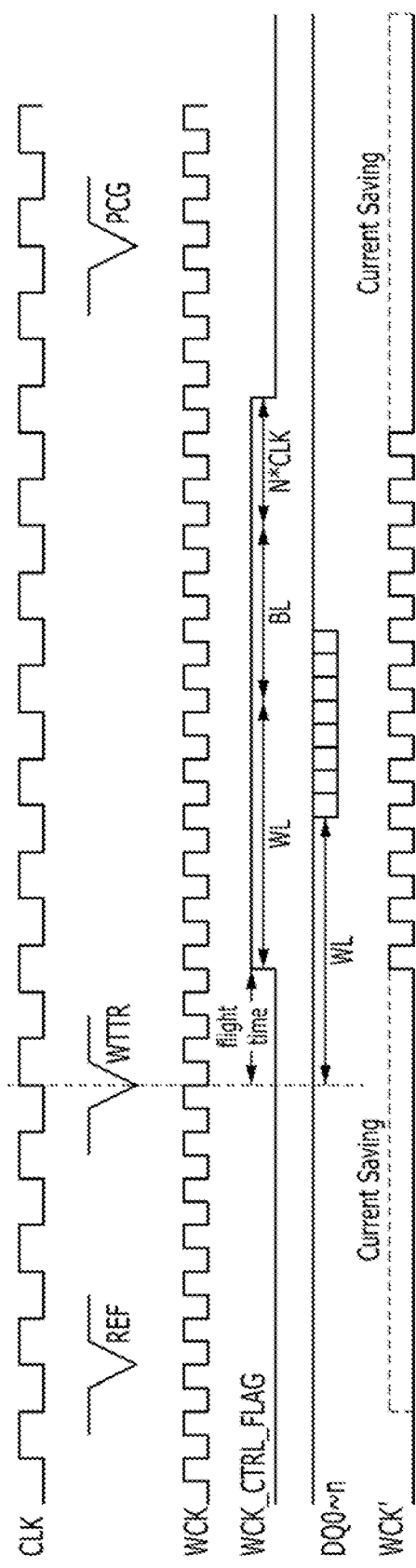
FIGS. 11 and 12 are timing diagrams describing a method of driving the semiconductor device shown in FIG. 6.
Figure 12:
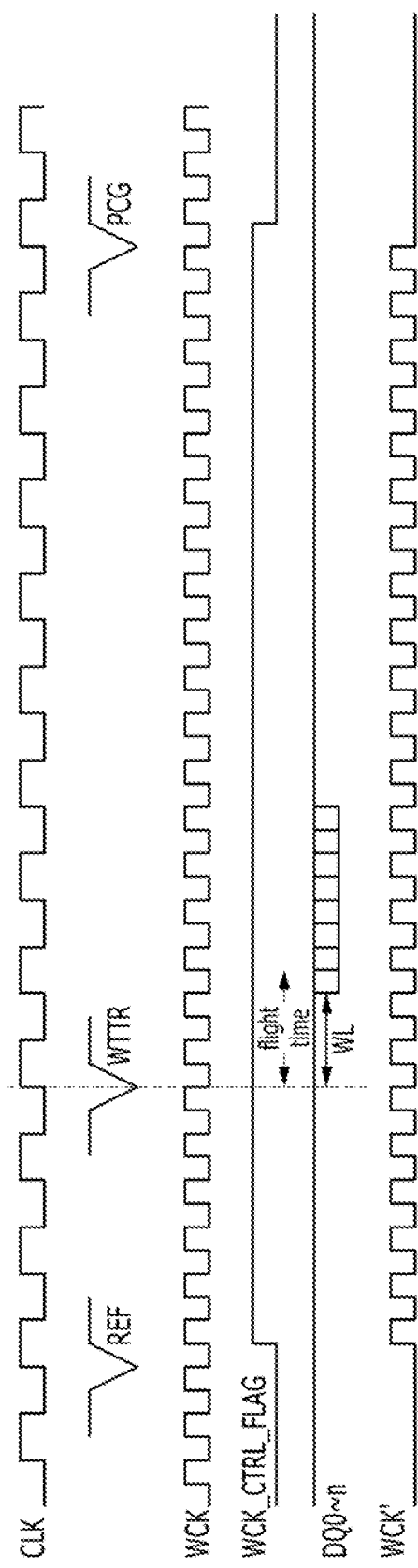

FIG. 11 is a timing diagram describing a method of driving the semiconductor device 200 shown in FIG. 6, under a first condition. FIG. 12 is a timing diagram describing a method of driving the semiconductor device 200 shown in FIG. 6, under a second condition.

The third clock control block 250 may compare the section information FT which is stored in advance with the write latency information WL included in the write-related information signal WTINs and determine which one of the first control signal WCK_CTRL0 and the second control signal WCK_CTRL1 is outputted as the clock control signal WCK_CTRL_FLAG. The section information FT may include the information on the section between the write training signal WTTR and the first control signal WCK_CTRL0 that is generated based on the write training signal WTTR, i.e., the information on the flight time. In other words, the section information FT may include information on a section ranging from when the semiconductor device enters the write training mode to when the first control signal WCK_CTRL0 is enabled.

When the flight time included in the section information FT is smaller than a write latency time included in the write latency information WL (WL>flight time), the third clock control block 250 may output the first control signal WCK_CTRL0 as the clock control signal WCK_CTRL_FLAG. When the flight time included in the section information FT is greater than the write latency time included in the write latency information WL (WL<flight time), the third clock control block 250 may output the second control signal WCK_CTRL1 as the clock control signal WCK_CTRL_FLAG. Hereinafter, where the first control signal WCK_CTRL0 is outputted as the clock control signal WCK_CTRL_FLAG is referred to as the first condition, and where the second control signal WCK_CTRL1 is outputted as the clock control signal WCK_CTRL_FLAG is referred to as the second condition.

The structure and operation corresponding to the first condition are described below.

Referring to FIG. 11, when the write training signal WTTR is generated from the command decoding block 210 in a state where the clock signal WCK is continuously inputted, the first clock control block 230 may generate the first control signal WCK_CTRL0 based on the write latency information WL and the burst length Information BL included in the write-related information signal WTINs. For example, the first clock control block 230 may generate the write training end signal WTTR_END by shifting the write training signal WTTR by a given delay amount corresponding to the write latency information WL, the burst length information BL and predetermined clock information N*CLK. Further, the first clock control block 230 may generate the first control signal WCK_CTRL0 that is enabled in response to the write training signal WTTR and disabled in response to the write training end signal WTTR_END.

The third clock control block 250 may output the first control signal WCK_CTRL0 as the clock control signal WCK_CTRL_FLAG under the first condition.

The data input block 260 may receive the data signals inputted from the data pads DQ0 to DQn in response to the clock control signal WCK_CTRL_FLAG and the clock signal WCK. For example, the data input block 260 may define a toggling section of the clock signal WCK to generate the limitation clock signal WCK' in response to the clock control signal WCK_CTRL_FLAG, synchronize the data signals with the limitation clock signal WCK', and transmit the synchronized data signals to internal circuits of the semiconductor device 200.

The structure and operation corresponding to the second condition are described below.

Referring to FIG. 12, when the semiconductor device 200 enters the auto refresh mode in a state where the clock signal WCK is continuously inputted, the second clock control block 240 may generate the second control signal WCK_CTRL1 in response to the auto refresh signal AREF and the precharge signal PCG which are sequentially generated from the command decoding block 210. For example, the second clock control block 240 may enable the second control signal WCK_CTRL1. In response to the auto refresh signal AREF and disable the second control signal WCK_CTRL1 in response to the precharge signal PCG.

The third clock control block 250 may output the second control signal WCK_CTRL1 as the clock control signal WCK_CTRL_FLAG under the second condition.

The data input block 260 may receive the data signals inputted from the data pads DQ0 to DQn in response to the clock control signal WCK_CTRL_FLAG and the clock signal WCK. For example, the data input block 260 may define a toggling section of the clock signal WCK to generate the limitation clock signal WCK' in response to the clock control signal WCK_CTRL_FLAG, synchronize the data signals with the limitation clock signal WCK', and transmit the synchronized data signals to the internal circuits of the semiconductor device 200.

In accordance with the embodiment of the present invention as described above, the semiconductor device has an advantage of restrictively using the clock signal during a section corresponding to the auto refresh mode or the write training mode based on the section information, i.e., the flight time, which is related to the write training mode.

In accordance with the embodiments of the present invention, the consumption of power may be reduced since a clock signal is inputted during a section using the clock signal.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the scope of the present invention as defined by the following claims.

What is claimed is:
1. A semiconductor device comprising:
a control block suitable for generating a clock control signal in response to a write training signal and a write-related information signal; and an input block suitable for receiving a data signal for a write training mode in response to the clock control signal and a clock signal,
wherein the control block includes:
a first control unit suitable for generating a write training end signal in response to the write training signal and the write-related information signal; and
a second control unit suitable for generating the clock control signal in response to the write training signal and the write training end signal.

2. The semiconductor device of claim 1, wherein the write-related information signal includes write latency information and burst length information.

3. The semiconductor device of claim 1, wherein the first control unit includes a shift register.

4. The semiconductor device of claim 1, wherein the second control unit includes an SR latch.

5. The semiconductor device of claim 1, wherein the input block includes:
a clock limitation unit suitable for generating a limitation clock signal by defining a toggling section of the clock signal in response to the clock control signal; and
an input buffer unit suitable for receiving the data signal in response to the limitation clock signal.

6. The semiconductor device of claim 1, further comprising:
a first pad suitable for receiving a command signal;
a command decoding block suitable for generating the write training signal in response to the command signal;
a Mode Register Set (MRS) circuit block suitable for generating the write-related information signal; and
a second pad suitable for receiving the data signal.

7. A semiconductor device comprising:
a first clock control block suitable for generating a first control signal in response to a write training signal and a write-related information signal;
a second clock control block suitable for generating a second control signal in response to a refresh signal and a precharge signal;
a third clock control block suitable for generating a clock control signal by selecting one of the first and second control signals in response to the write-related information signal; and
a data input block suitable for receiving a data signal for a write training mode in response to the clock control signal and a clock signal.

8. The semiconductor device of claim 7, wherein the write-related information signal includes write latency information and burst length information.

9. The semiconductor device of claim 7, wherein the first clock control block includes:
a first control unit suitable for generating a write training end signal in response to the write training signal and the write-related information signal; and
a second control unit suitable for generating the first control signal in response to the write training signal and the write training end signal.

10. The semiconductor device of claim 9, wherein the first control unit includes a shift register.

11. The semiconductor device of claim 9, wherein the second control unit includes an SR latch.

12. The semiconductor device of claim 7, wherein the second clock control block includes an SR latch.

13. The semiconductor device of claim 8, wherein the third clock control block includes:
a selection control unit suitable for generating a selection control signal based on the write latency information and section information on a flight time between the write training signal and the first control signal; and
a selection output unit suitable for outputting the clock control signal by selecting one of the first and second control signals in response to the selection control signal.

14. The semiconductor device of claim 13, wherein the selection control unit includes a storing part for storing the section information.

15. The semiconductor device of claim 7, wherein the data input block includes:
a clock limitation unit suitable for generating a limitation clock signal by defining a toggling section of the clock signal in response to the clock control signal; and
an input buffer unit suitable for receiving the data signal in response to the limitation clock signal.

16. The semiconductor device of claim 7, further comprising:
a first pad suitable for receiving a command signal;
a command decoding block suitable for generating the write training signal, the refresh signal and the precharge signal in response to the command signal;
a Mode Register Set (MRS) circuit block suitable for generating the write-related information signal; and
a second pad suitable for receiving the data signal.

17. A method of driving a semiconductor device capable of entering a write training mode while entering a refresh mode, comprising:
selecting one of a first control signal corresponding to the write training mode and a second control signal corresponding to the refresh mode by comparing write latency information with section information on a section ranging from when entering the write training mode to when the first control signal is generated;
generating a clock control signal in response to the first control signal or the second control signal when entering the write training mode or the refresh mode;
generating a limitation clock signal by defining a toggling section of a clock signal in response to the clock control signal; and
receiving a data signal for the write training mode in response to the limitation clock signal.

18. The method of claim 17, wherein the first control signal is generated based on the write latency information and the burst length information when the semiconductor device enters the write training mode.

19. The method of claim 17, wherein the second control signal is generated in response to a refresh signal and a precharge signal when the semiconductor device enters the refresh mode.

* * * * *